(12) United States Patent
Lee et al.

(10) Patent No.: US 9,320,132 B2
(45) Date of Patent: Apr. 19, 2016

(54) GROUND DEVICE AND PORTABLE TERMINAL HAVING THE SAME

(71) Applicant: Samsung Electronics Co., Ltd., Gyeonggi-do (KR)

(72) Inventors: Jun-Hwan Lee, Gyeongsangbuk-do (KR); Myung-Soo Kim, Gyeonggi-do (KR); Tae-Hwa Moon, Daegu (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 602 days.

(21) Appl. No.: 13/714,572

(22) Filed: Dec. 14, 2012

(65) Prior Publication Data

US 2013/0155638 A1   Jun. 20, 2013

(30) Foreign Application Priority Data

Dec. 16, 2011   (KR) .......................... 10-2011-0136552

(51) Int. Cl.
*H05K 7/14*   (2006.01)
*H05K 1/02*   (2006.01)

(52) U.S. Cl.
CPC .................... *H05K 1/0215* (2013.01)

(58) Field of Classification Search
CPC ............... H05K 1/0215; H05K 9/0039; H01R 13/65802
See application file for complete search history.

(56) References Cited

U.S. PATENT DOCUMENTS

| | | | | |
|---|---|---|---|---|
| 6,149,443 A | * | 11/2000 | Moran | 439/66 |
| 6,377,448 B1 | * | 4/2002 | Liu et al. | 361/679.33 |
| 6,456,504 B1 | * | 9/2002 | LoForte et al. | 361/799 |
| 7,738,260 B2 | * | 6/2010 | Stanley et al. | 361/799 |
| 7,938,647 B2 | * | 5/2011 | Zheng et al. | 439/66 |
| 8,406,008 B2 | * | 3/2013 | Han | 361/799 |
| 2007/0052100 A1 | * | 3/2007 | Bellinger | 257/758 |
| 2007/0133187 A1 | * | 6/2007 | Lin et al. | 361/799 |
| 2009/0295649 A1 | | 12/2009 | An et al. | |
| 2011/0095025 A1 | | 4/2011 | Han | |
| 2011/0124246 A1 | | 5/2011 | Ouyang et al. | |

FOREIGN PATENT DOCUMENTS

| | | |
|---|---|---|
| CN | 201303059 Y | 9/2009 |
| CN | 201336421 Y | 10/2009 |
| CN | 101594400 A | 12/2009 |

(Continued)

*Primary Examiner* — Robert J Hoffberg
*Assistant Examiner* — Hung Dang
(74) *Attorney, Agent, or Firm* — Cha & Reiter, LLC

(57) ABSTRACT

Provided are a ground device and a portable terminal having the same. The ground device for connecting an inner metallic material with an outer metallic material includes a ground piece electrically connected with the inner metallic material and a connection terminal portion which is bent to extend as one piece from the ground piece and is connected with the outer metallic material. A portable terminal includes an inner metallic material provided in an inner side of a main body of the portable terminal, an outer metallic material provided in a battery cover provided in an outer side of the main body, and a ground device for connecting the inner metallic material with the outer metallic material, and the ground device includes a ground piece mounted in the main body to be connected with the inner metallic material and a connection terminal portion which is multi-step bent as one piece from the ground piece to be connected with the outer metallic material.

20 Claims, 6 Drawing Sheets

(56) References Cited

FOREIGN PATENT DOCUMENTS

| CN | 201608962 U | 10/2010 |
| CN | 101959384 A | 1/2011 |
| CN | 101964457 A | 2/2011 |
| CN | 102082330 A | 6/2011 |
| DE | 195 10 173 C1 | 4/1996 |
| KR | 20-2010-0008686 U | 9/2010 |
| KR | 10-2011-0048446 A | 5/2011 |

* cited by examiner

GROUND DEVICE AND PORTABLE TERMINAL HAVING THE SAME

CLAIM OF PRIORITY

This application claims the benefit under 35 U.S.C. §119(a) from a Korean Patent Application filed in the Korean Intellectual Property Office on Dec. 16, 2011 and assigned Serial No. 10-2011-0136552, the disclosure of which is hereby incorporated by reference in its entirety

BACKGROUND OF THE INVENTION

1. Field of the Invention

The present invention generally relates to a ground device and a portable terminal having the same, and more particularly, to a ground device for electrically connecting an outer metallic material with an inner metallic material and a portable terminal incorporating the ground device.

2. Description of the Related Art

Generally, a portable terminal refers to an electronic device which allows a user to perform a communication function such as voice communication or message transmission and to also enjoy multimedia services such as storage of various data and information, play of games, and watching of moving video images. The portable electronic device has been manufactured in various forms such as an electronic note, a palm Personal Computer (PC), a portable game player, a moving image/music file player, a cellular phone, a notebook PC, etc.

Recently, with the integration of the aforementioned moving image/music file reproduction and an electronic note or notebook PC functions, as well as functions of a mobile communication device, into a portable terminal such as a cellular phone, a user can enjoy various contents such as a banking service like retail payment, a game/multimedia service, and the like as well as the communication function such as voice communication through the portable terminal That is, the portable terminal, at its initial stage development, merely provided a voice communication or short message transmission service. However, as the portable terminal has been miniaturized and highly integrated with the development of electronic/communication technologies, the portable terminal is now equipped with a security function allowing a user to perform a greater variety of functions. For example a user may access banking services, multimedia functions allowing a user to enjoy games/moving images, and simple office work functions including Internet or mail transmission/reception all in addition to the unique communication function of the portable terminal.

Such a portable terminal includes a separate battery pack for power supply thereto, and a battery cover for covering the battery pack is removably mounted on a rear side of the portable terminal. The battery cover is made of a metallic material to secure binding with the portable terminal. However, in the case where the battery cover is made of the metallic material, leakage current may flow through the battery cover thus, causing displeasure to a user. In addition, conductivity characteristics of the metallic material may affect operations of an inner metallic material or radiation characteristics of an antenna, making it difficult to stabilize operations of the portable terminal To solve such a problem, a pogo-pin or a connector having a c-clip structure is surface-mounted on a Printed Circuit Board (PCB) or a Flexible Circuit Board (FCB) as a Surface-Mount Device (SMD) for grounding.

A structure of a conventional ground device is disclosed in Korean Patent Publication No. 10-2011-0048446 (published on May 11, 2011 and entitled "Pressure Contact Connector with Pogo Pin"). However, when such a pogo-pin is used, durability is degraded and due to the use of an expensive part such as the pogo-pin, the cost of the portable terminal increases.

FIG. 1 shows an example in which a connector in a c-clip shape is used. In FIG. 1, the connector structured in the c-clip shape according to prior art is fixed on a PCB. Referring to FIG. 1, a ground device 1 having the c-clip structure includes a PCB 3 connected to an inner metallic material (not shown), a c-clip connector 2 having a c-clip shape, which is mounted on the PCB 3 through soldering, and a reinforcing plate 4 for reinforcing the PCB 3.

The c-clip connector 2 includes a fixing pin 2a mounted onto the PCB 3 by soldering or the like, a support piece 2b protruding from the fixing pin 2a to provide an elastic force, and a contact terminal 2c protruding from the support piece 2b to contact outside. A support protrusion 5 protrudes from an end portion of the fixing pin 2a toward the contact terminal 2c to support the contact terminal 2c and limit the amount of movement as the contact terminal 2c is pressed.

Since the c-clip connector 2 has to be mounted on the PCB 3 as an SMD through soldering or the like, it may be broken or separated by a shock.

In addition, the c-clip connector 2 is mounted along the PCB 3 so as to be connected with a main PCB (not shown), increasing the cost.

Furthermore, because being mounted on the PCB 3 as an SMD, the c-clip connector 2 has a limitation in height to which it can elastically move.

SUMMARY OF THE INVENTION

Accordingly, the present invention provides a ground device whose structure is simplified and reliability is improved by realizing a contact terminal, which is connected with an inner metallic material and contacts an outer metallic material, in a single shape, and a portable terminal having the ground device.

The present invention also provides a ground device whose durability is improved and whose cost is reduced together with providing for ease of manufacturing, and a portable terminal having the ground device.

According to an aspect of the present invention, there is provided a ground device for connecting an inner metallic material with an outer metallic material. The ground device includes a ground piece electrically connected with the inner metallic material and a connection terminal portion which is bent into a shape to extend as one piece from the ground piece and is connected with the outer metallic material.

The connection terminal portion may include an elastically deformable support portion which is bent into a shape to extend as one piece from an edge of a side of the ground piece and elastically supports pressing of the connection terminal portion and a contact terminal which is bent to protrude as one piece from an end portion of the elastically deformable support potion in a direction away from the ground piece and contacts the outer metallic material.

The elastically deformable support portion may be bent to extend as one piece from a longitudinal end portion of the ground piece in a semi-circular shape such as for example the shape of "C", and the contact terminal may be bent to protrude as one piece from a "C"-shape upper end portion in a arch shape such as for example the shape of "∩".

In the ground piece there may be provided a connection mounting portion for mounting the inner metallic material and the ground piece thereon, such that the inner metallic material and the ground piece are electrically contactable with each other.

The connection terminal portion may extend as one piece from an edge of a side of the ground piece, the connection terminal being bent into a shape to extend in a protruding fashion from the edge of the side of the ground piece toward an edge of the other side of the ground piece.

In the ground piece may be further provided a support piece for supporting the connection terminal portion when the connection terminal portion is pressed.

The support piece may be bent as one piece from the edge of the other side of the ground piece, the support piece protruding toward an inner side of the connection terminal portion.

The ground device may be manufactured by press molding.

According to another aspect of the present invention, there is provided a portable terminal which includes an inner metallic material provided in an inner side of a main body of the portable terminal, an outer metallic material provided in a battery cover provided in an outer side of the main body, and a ground device for connecting the inner metallic material with the outer metallic material, where the ground device includes a ground piece mounted in the main body to be connected with the inner metallic material and a connection terminal portion which is multi-step bent as one piece from the ground piece to be connected with the outer metallic material.

The connection terminal portion may include an elastically deformable support portion which is bent as one piece from an edge of the ground piece, the elastically deformable support portion being bent to extend as one piece from a longitudinal edge portion of the edge of the ground piece toward an edge portion facing the longitudinal edge portion, and a contact terminal which is bent to protrude as one piece from an end portion of the elastically deformable support portion and contacts the outer metallic material.

Within the inner side of the main body there may be provided a ground surface on which the ground piece is placed and engaged.

In the ground surface there may be formed a ground opening which passes through the inner side and the outer side of the main body to allow the connection terminal portion to be exposed outside the main body.

In the ground piece there may be provided a fixing portion for bonding the ground piece onto the ground surface and a connection mounting portion for mounting the inner metallic material at a location within the inner side of the main body and mounting the ground piece thereon, such that the inner metallic material and the ground piece are electrically contactable with each other.

In the connection mounting portion there may be provided an engagement member for engaging the inner metallic material within the connection terminal portion, such that the inner metallic material and the connection terminal portion are electrically contactable with each other.

The ground piece may be installed on the ground surface, and the connection terminal portion may pass through the ground opening to be in contact with the outer metallic material.

In the ground piece there may be further provided a support piece for supporting the connection terminal portion when the contact terminal is pressed.

The support piece may be bent as one piece from the ground piece, the support piece being bent to extend from an edge portion of the edge of the ground piece, which faces the edge from which the elastic support portion is bent, and protruding toward the inner side of the contact terminal.

The elastic support portion may be bent to extend as one piece from a longitudinal end portion of the ground piece in a semi-circular shape such as for example the shape of "C", and the contact terminal may be bent to protrude as one piece from a "C"-shape upper end portion in a arch shape such as for example the shape of "∩".

BRIEF DESCRIPTION OF THE DRAWINGS

The above and other features and advantages of an exemplary embodiment of the ground device and portable terminal having the same according to the present invention will become more apparent to a person of ordinary skill in the art from the following detailed description taken in conjunction with the accompanying drawings, in which.

DETAILED DESCRIPTION OF THE EXEMPLARY EMBODIMENT

Figure 1:
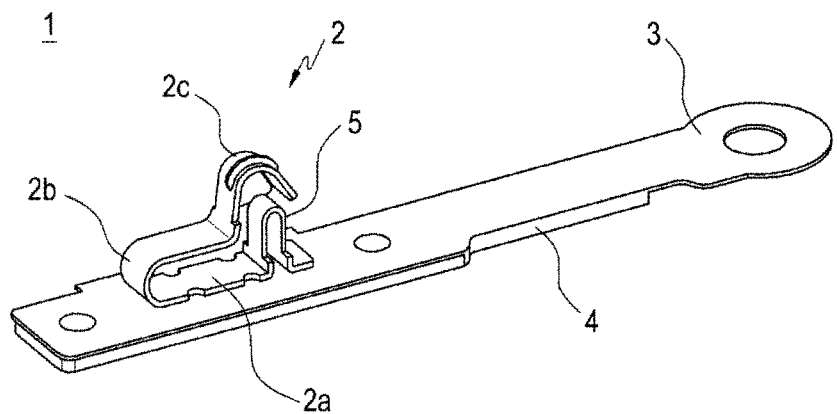
FIG. 1 schematically shows a ground device having a c-clip structure according to prior art.

Hereinafter, an exemplary embodiment of a portable terminal including a ground device according to the present invention will be described with reference to the accompanying drawings. In the following description, thicknesses of lines or sizes of components shown in the drawings may be exaggerated for clarity and convenience of the description. In the following description, well-known functions or constructions may not be described in detail when they would obscure appreciation of the present invention by a person of ordinary skill in the art with unnecessary detail of the well-known functions and structures. Also, the terms used herein are defined according to the functions of the present invention as would be understood by a person of ordinary skill in the art. Thus, the terms may vary depending on user's or operator's intension and usage. That is, the terms used herein must be understood based on the descriptions made herein in view of the ordinary level of skill in the art on the basis of contents over this specification.

Figure 2:
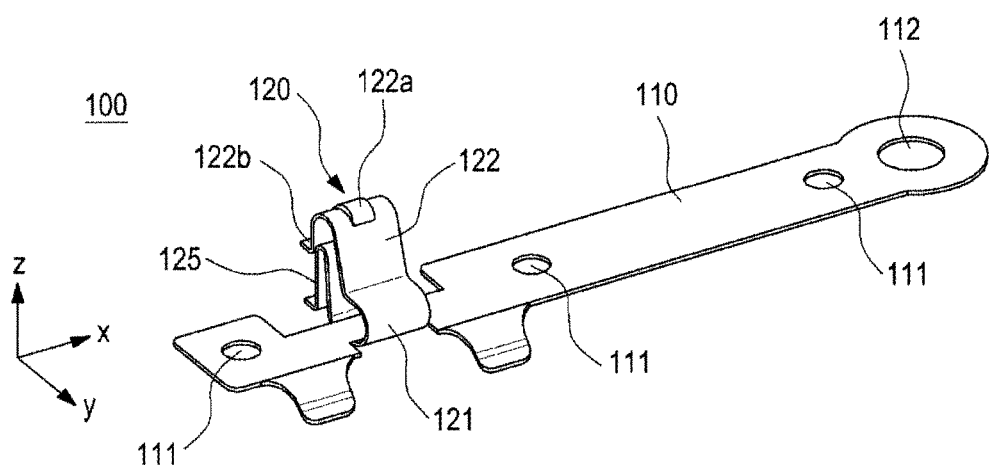
FIG. 2 schematically shows a ground device according to an exemplary embodiment of the present invention.

FIG. 2 is a perspective view schematically showing a ground device 100 according to an embodiment of the present invention.

Referring to FIG. 2, the ground device 100 includes a ground piece 110 and a connection terminal portion 120. The connection terminal potion 120 is formed by being bent integrally from the one piece which forms the ground piece 110.

More specifically, the connection terminal portion 120 in a c-clip shape is bent integrally from the one piece which forms the ground piece 110 to extent from a side of the edge of the ground piece 110. The connection terminal portion 120 protrudes from one side of the ground piece 110 and is bent from that side toward the other side of the ground piece 110. In the ground piece 110, a support piece 125, which is to be described later, as well as the connection terminal portion 120 is formed integrally therewith, such that the support piece 125 is bent to extend integrally from the side opposite the connection terminal portion of the ground piece 110. A fixing portion 111 and a connection mounting portion 112 are further provided as will be described below.

In the present invention, the ground device 100 is described with an example in which the ground piece 110, the connection terminal portion 120, and the support piece 125 are manufactured as one piece in an integrated form through press molding. That is, the ground device 100 is manufactured using a conductive material without passing through an assembly stage such as assembly or processing, such that the ground piece 110, the connection terminal portion 120, and the support piece 125 are formed from a single piece of conductive material. However, the ground device 100 according to the present invention is not limited to press molding, and any manufacturing method and assembly of the ground device 100 are possible as long as the ground device 100 can be formed as one piece, such as when the ground piece 110, the connection terminal portion 120, and the support piece 125 are formed as one piece by melting a conductive material with the use of casting. The ground piece 110 is fixed to an inner side of a main body 12 of a portable terminal 10 and is connected to electrically contact an inner metallic material 13. In the current exemplary embodiment, the ground piece 110 is in a longitudinally extended shape and is bonded onto a ground surface 12a of the main body 12. The ground piece 110 is provided with the fixing portion 111 and the connection mounting portion 112. A plurality of fixing portions 111 are formed on the ground piece 110 to fix the ground piece 110 onto the main body 12 and set a fixing position of the ground piece 110. The fixing portions 111 are in the shape of apertures or holes and are bonded to the ground surface 12a to fix the ground piece 110 to the main body 12. The connection mounting portion 112 is provided on a side of the ground piece 110 (the right side in FIG. 2), and a conductive engagement member 14 is fixed to the connection mounting portion 112. The connection mounting portion 112 is also in the shape of an aperture or hole, and the engagement member 14 passing through the inner metallic material 13 is mounted onto the connection mounting portion 112. By fixing the connection mounting portion 112 and the engagement member 14, the ground device 100 is coupled to and electrically connected with the inner metallic material 13.

The connection terminal portion 120 is provided integrally as one piece with the ground piece 110. The connection terminal portion 120 includes an elastically deformable support portion 121 and a contact terminal 122. The connection terminal portion 120 is connected in a contacting manner with an inner side of the battery cover 11 removable from the main body 12 of the portable terminal 10. The connection terminal portion 120 is disposed on the other side of the ground piece 110 (the left side in FIG. 2), and is bent to extend integrally as one piece from the ground piece 110. More specifically, the connection terminal portion 120 is bent to protrude perpendicularly from a side of the ground surface 12a (a z-axis direction in FIG. 2), but the connection terminal portion 120 is bent to extend in a protruding fashion from the longitudinal edge of the ground piece 110 along the x-axis direction depicted in FIG. 2.

The elastic support portion 121 supports the contact terminal 122, and provides an elastic force to the contact terminal 122 when the contact terminal 122 is pressed by contacting an outer metallic material 11a. The elastic support portion 121 extends to protrude from a portion of the edge along the x-axis longitudinal direction of the ground piece 110 and at the same time, is bent to face a surface of the ground piece 110. To be more specific for the shape of the elastic support portion 121, the elastic support portion 121 is bent to form a "C" shape integrally as one piece from a portion of the longitudinal x-axis direction edge depicted in FIG. 2 of the ground piece 110.

In the current embodiment, the elastic support portion 121 is elastic-deformably bent to support pressing of the contact terminal 122 which will be described below. That is, the contact terminal 122 is elastically supported by the elastic support portion 121, such that when the contact terminal 122 is pressed by the battery cover 11, the elastic support portion 121 provides an elastic force working in the opposite direction to the pressing force. Therefore, when the battery cover 11 is not mounted on the main body 12, the contact terminal 122 keeps protruding outside the main body 12 through a connection opening 12c. Once the battery cover 11 is mounted on the main body 12, the contact terminal 122 undergoes interference with the battery cover 11 and the contact terminal 122 is pressed by a force and urged toward the main body 12. Hence, the contact terminal 122 contacts the outer metallic material 11a of the battery cover 11 and the contact terminal 122 keeps contacting the outer metallic material 11a by means of an elastic force of the elastic support portion 121. The contact terminal 122, may thus return to it position protruding outside the main body 12 when the battery cover 11 is removed.

The contact terminal 122 is exposed to outside through a structure such as the connection opening 12c formed on the ground surface 12a, to directly contact the outer metallic material 11a, such that the contact terminal 122 protrudes and is bent in a vertical direction (the z-axis direction depicted in FIG. 2). More specifically, the contact terminal 122 is formed to extend in a protruding fashion integrally from an upper end portion of the elastic support portion 121 in a semi-circular shape, for example the shape of a "C". The contact terminal 122, is formed in a protruding fashion in an arch shape, for example the shape of "∩" that is open to the surface of the ground piece 110. The contact terminal 122 extends as one piece from an end portion of the elastic support portion 121.

The support piece 125 is provided to support pressing of the connection terminal portion 120. More specifically, the support piece 125 is formed as an integral piece from a portion of the edge of the ground piece 110 which faces the end portion of the elastic support portion 121, and the support piece 125 is bent to extend toward an inner sidewall of the contact terminal 122. That is, once the contact terminal 122 is pressed by the outer metallic material 11a, the elastic support portion 121 is elastically pressed towards the ground piece 110. If a force exerted on the contact terminal 122 increases, the elastic support portion 121 is pressed to gradually move closer toward the ground piece 110. When the contact terminal 122 moves close enough to the ground piece 110, the contact terminal will bear against the support piece 125, thus the support piece 125 supports the contact terminal 122 to prevent the contact terminal 122 from further moving to the ground piece 110. Therefore, the support piece 125 can limit the force exerted onto the elastic support portion 121 to prevent the elastic support portion 121 from being deformed by a larger force than a predetermined level. As such, the support piece 125 may also function as a supplementary elastic support for the elastic support portion 121.

The ground device 100 in formed of an integral deformable component, and has a simple structure based on the integrated form, such that the ground device 100 can be mounted in a small space of the main body 12 of the portable terminal 10 and can be connected with the inner metallic material 13. Therefore, electromagnetic waves generated in the inner metallic material 13 are grounded through the ground device 100, thereby minimizing problems caused by electromagnetic waves or leakage current of the inner metallic material 13 and improving reliability per function of the inner metallic material 13, such that the reliability of the portable terminal can also be enhanced. For example, for an antenna affected much by electromagnetic waves or leakage current, reception performance can be increased and thus the reliability of the antenna can be improved.

Figure 3:
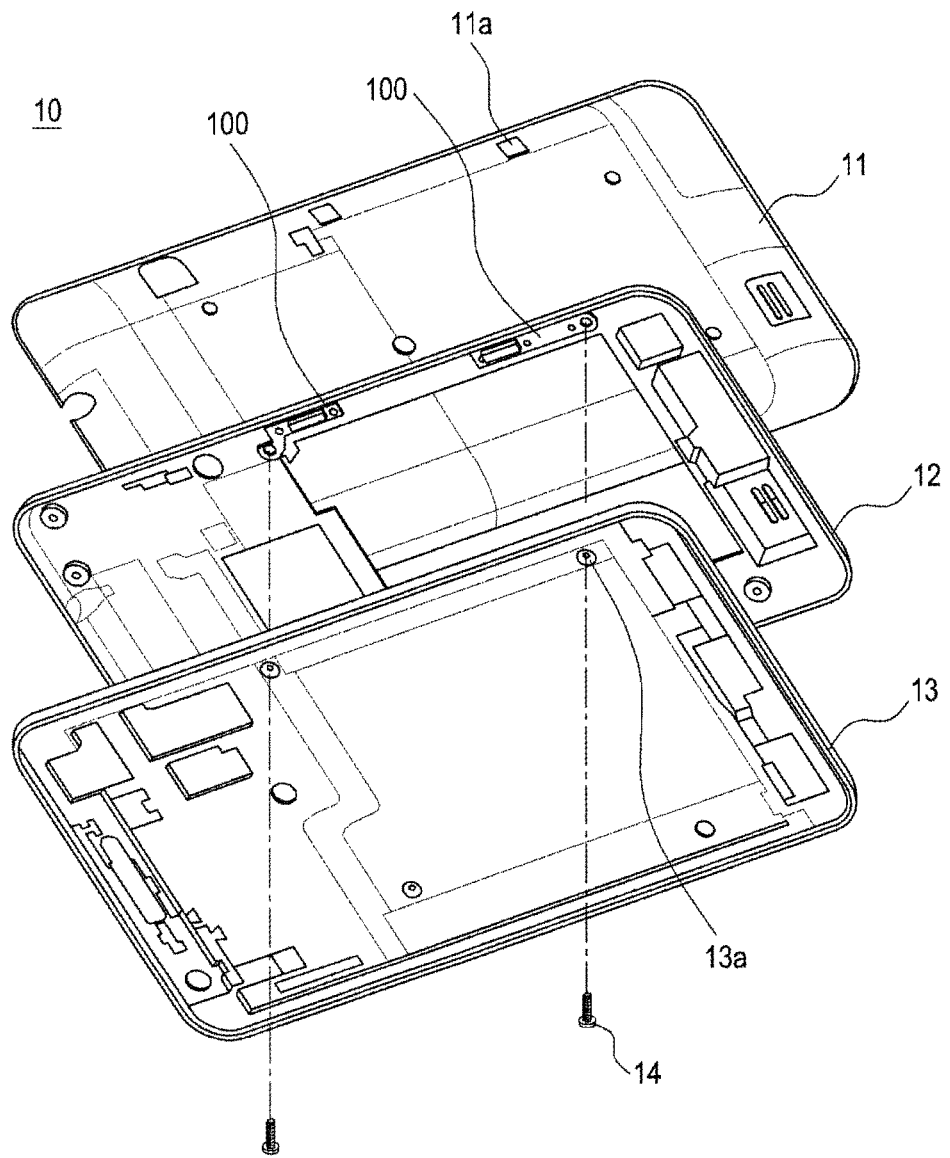
FIG. 3 is an exploded perspective view schematically showing a ground device shown in FIG. 2 and a portable terminal according to an exemplary embodiment of the present invention.

FIG. 3 is an exploded perspective view of the portable terminal 10 having the ground device 100 according to an embodiment of the present invention.

Referring to FIG. 3, the portable terminal 10 includes the terminal main body 12, the battery cover 11 made of a metallic material, and the ground device 100. In the current embodiment, the main body 12 is described as being disposed on a rear side of which the battery cover 11 is mounted. This is because by grounding current generated in the inner metallic material 13 disposed in an inner side of the main body 12 to the battery cover 11 through the ground device 100, a user is protected from experiencing an electrical shock.

Figure 4:
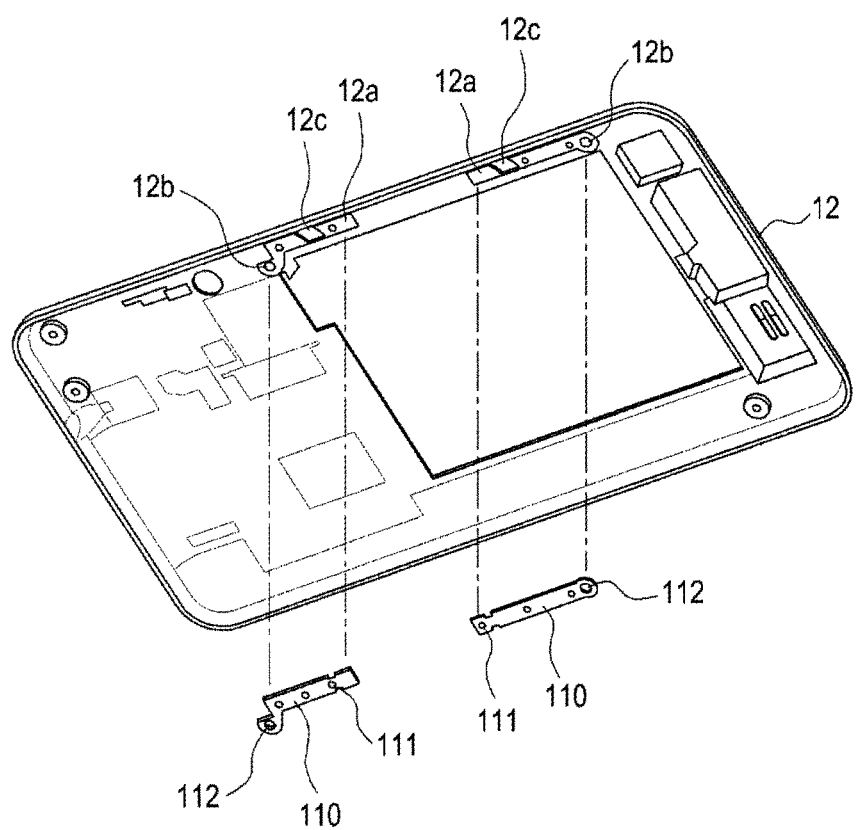
FIG. 4 shows a main body and a ground device of FIG. 3, which are separated from each other.
Figure 5:
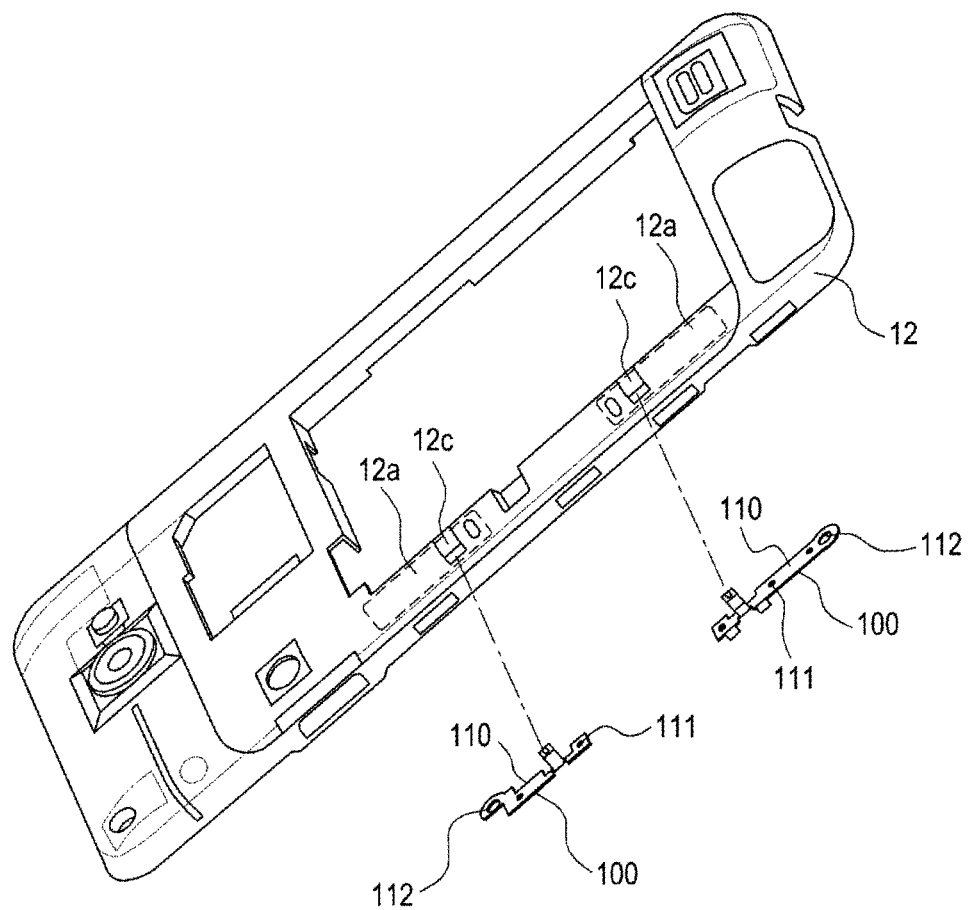
FIG. 5 shows an inner side of a battery cover of a portable terminal in FIG. 3.

FIG. 4 shows the ground device 100 and the main body 12 having the ground device 100 mounted thereon, which in the portable terminal 10 shown in FIG. 3 are separated from each other. FIG. 5 shows an inner side of the battery cover 11 of the portable terminal 10 in FIG. 3.

Referring to FIGS. 4 and 5, the ground surface 12a is disposed on an inner side of the main body 12 on which the ground device 100 is mounted. In the ground surface 12 is formed the connection opening 12c which passes through an inner side and an outer side of the main body 12. The ground piece 110 is bonded onto the ground surface 12a and the connection terminal portion 120 is inserted into the connection opening 12c, such that the contact terminal 122 protrudes and is exposed outside the main body 12. In the ground surface 12a there is provided a boss hole 12b facing the connection mounting portion 112 of the ground piece 110, as well as the connection opening 12c. As the engagement member 14 is engaged through the inner metallic material 13 with the connection mounting portion 112 and the boss hole 12b, the inner metallic material 13 may be affixed to the main body 12 and the ground device 100 may be fixed while being positioned between the main body 12 and the inner metallic material 13.

Figure 6:
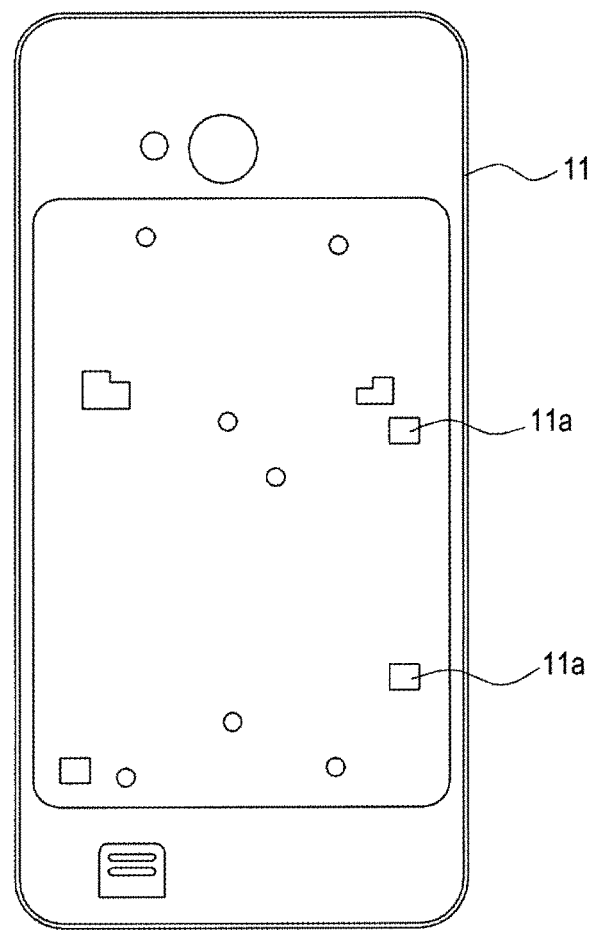
FIG. 6 is an exploded perspective view showing a main body and a ground device of FIG. 4, which are viewed from another angle.

FIG. 6 shows an exploded perspective view of the main body 12 and the ground device 100 of FIG. 4, which are viewed from another angle.

Referring to FIG. 6, the battery cover 11 covers a battery (not shown) provided in the main body 12 and is removably mounted on a rear side of the main body 12. The battery cover 11 may be coated with an insulating material. By coating the battery cover 11 with an insulating material, it is possible to prevent current leaking toward the battery cover 11 from being delivered to and thus electrocuting a user. In an inner side of the battery cover 11 there is provided the outer metallic material 11a which contacts the contact terminal 122. The outer metallic material 11 may be made of conductive Stainless Using Steel (SUS) for example. The outer metallic material 11a for contacting the contact terminal 122 is provided in the inner side of the battery cover 11. When the battery cover 11 is mounted on the main body 12, the outer metallic material 11a conductively contacts the contact terminal 122, thus grounding static electricity or current introduced from the inner metallic material 13 into the ground device 100.

Figure 7:
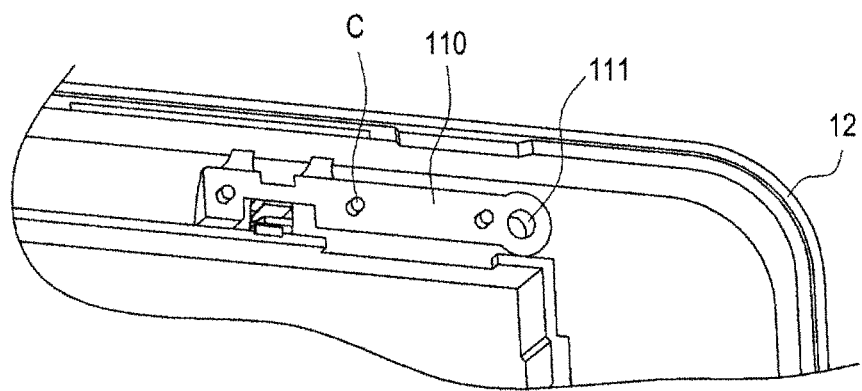
FIG. 7 is a perspective view showing a state in which a ground device is mounted on a ground surface of a main body in FIG. 4.
Figure 8:
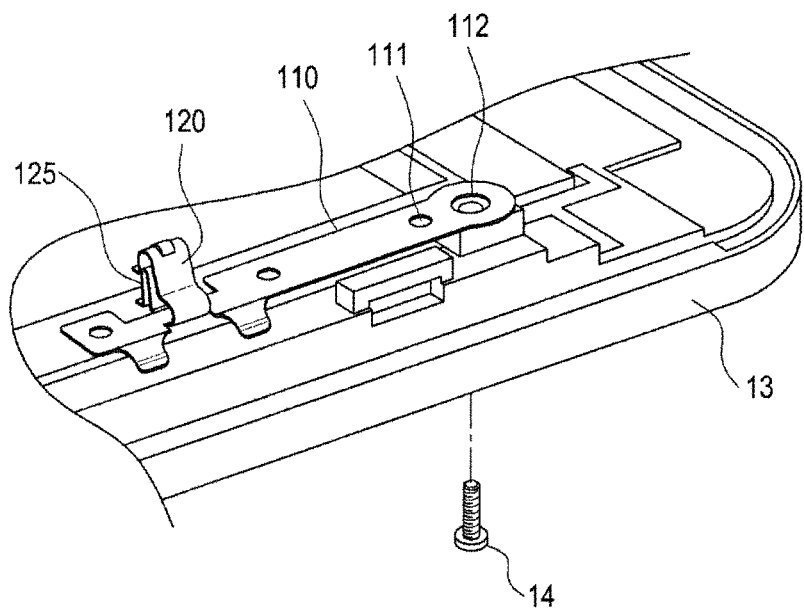
FIG. 8 is a perspective view showing a state in which a ground device contacts an inner metallic material disposed in an inner side of a main body in FIG. 3.

FIG. 7 is a perspective view showing a state in which the ground device 100 is mounted on the ground surface 12a of the main body 12 in FIG. 4, and FIG. 8 is a perspective view showing a state in which the ground device 100 contacts the inner metallic material 13 disposed in the inner side of the main body 12 in FIG. 3.

While a detailed structure of the ground device 100 has been described above, a more specific mounting state of the ground device 100 in the portable terminal 10, is shown in FIGS. 7 and 8. As shown in FIGS. 7 and 8, the ground piece 110 is disposed on the ground surface 12a of the main body 12, and the ground piece 110 is fixed onto the ground surface 12a through bonding between the fixing portion 111 and the main body 12. The inner metallic material 13 is disposed within the inner side of the main body 12, such that the ground device 100 is disposed between the inner side of the main body 12 and the inner metallic material 13. When the inner metallic material 13 is placed on the main body 12, the connection terminal portion 120 protruding from a surface of the ground piece 110 is inserted into the connection opening 12c which is disposed on the ground surface 12a. In particular, since the connection terminal portion 120 protrudes as a single piece from the edge of the ground piece 110, the volume occupied by the ground device 100 in the inner side of the main body 12 can be minimized. Therefore, the connection terminal portion 120 is inserted into the connection opening 12c while facing toward the ground surface 12a. The protruding height of the connection terminal portion 120 may be set larger than a thickness of the main body 12, such that after the connection terminal portion 120 passes through the connection opening 12c, the contact terminal 122 protrudes from the outer side of the main body 12. Consequently, when the battery cover 11 is mounted on or dismounted from the main body 12, the bent surface 122a of the contact terminal 122 is depressed and thus contacts the outer metallic material 11a or the pressing is released and thus the contact is released.

When the ground device 100 in which the support piece 125 and the connection terminal portion 120 are formed as a single piece in an integrated form is disposed on the ground surface 12a of the main body 12, the inner metallic material 13 is disposed on the inner sidewall of the main body 12. An opening 13a of the inner metallic material 13, the connection mounting portion 112 of the ground device 100, and the boss hole 12b of the main body 12 are aligned to be connected to one another. Once the connection mounting portion 112 and the boss hole 12b are engaged through the opening 13a of the inner metallic material 13, an electrical connection is made such that current can flow through the inner metallic material 13, the engagement member 14, the ground piece 110, and the contact terminal 122 in that order. Therefore, the remaining current or electric field of the inner metallic material 13 is conducted through to the ground piece 110 through the connection mounting portion 112. The connection mounting portion 112 is connected by the engagement member 14, and the current is grounded to the battery cover 11 which is connected to the contact terminal 122 in through the connection terminal portion 120.

Once the battery cover 11 is mounted on the main body 12, the outer metallic material 11a of the battery cover 11 is depressed while contacting an end portion of the contact terminal 122 which protrudes outside the main body 12. As the contact terminal 122 is depressed, the elastic support portion 121 elastically supports the contact terminal 122 and exerts a force toward the contact terminal 122 to maintain the electrical conductive state of the contact terminal 122. Thus, the inner metallic material 13 and the outer metallic material 11a are electrically connected with each other.

Because the ground device 100 in which the support piece 125 and the connection terminal portion 120 are formed as a single piece in an integrated form, the ground device 100 is not likely to be deformed or broken by an external shock applied to the portable terminal 10. Moreover, the reliability of the inner metallic material 13 is improved for grounding electromagnetic waves, leakage current, and remaining current from the inner metallic material 13, and the structure of the ground device 100 is simplified. Furthermore, because the connection terminal portion 120 directly protrudes from the ground piece 110, the volume or space occupied by the ground device 100 in the inner side of the main body 12 can be minimized. In addition, by reducing the volume or space occupied by the ground device 100, the ground device 100 can be mounted without increasing the size of the main body 12, and therefore the utilization of the ground device 100 can be enhanced.

As is apparent from the foregoing description, by forming the ground piece and the connection terminal portion in a single piece in an integrated from, the structure of the ground device can be simplified.

Moreover, as the ground piece and the connection terminal portion are formed in a single piece, the durability and reliability of the ground device are improved and the lifespan of the ground device is lengthened.

In addition, as the ground device is provided in an integrated form, it is easy to manufacture the ground device and install the same in a terminal having a limited space.

Furthermore, the cost of the ground device is reduced when compared to a conventional separate connector that is constructed from more than one piece, and the ground device can be easily manufactured and installed with a proper size even on a small space.

While a detailed embodiment of the present invention has been described, various modifications can be carried out without departing from the scope of the present invention. Therefore, the scope of the invention is not defined by the foregoing embodiment of the invention, but should be defined by claims and equivalents thereof.

What is claimed is:

1. A ground device for connecting an inner metallic material with an outer metallic material, the ground device comprising:
    a ground piece electrically connected with the inner metallic material; and
    a connection terminal portion which is integrally formed from a single piece with the ground piece by bending the connection terminal portion to extend from the ground piece and is connected with the outer metallic material, wherein the connection terminal portion is crossed over the ground piece.

2. The ground device of claim 1, wherein the connection terminal portion comprises:
    an elastic support portion which is integrally formed from a single piece with the ground piece by bending the elastic support portion to extend from an edge of a side of the ground piece and elastically supports depressing of the connection terminal portion; and
    a contact terminal which is integrally formed from a single piece with the grounding piece by bending the contact terminal to protrude from an end portion of the elastic support potion in a direction away from the ground piece and electrically connected to the outer metallic material.

3. The ground device of claim 2, wherein the elastic support portion is bent to extend as one piece from a longitudinal end portion of the ground piece in a semi-circular shape of a "C", and
    the contact terminal is bent to protrude as one piece from a "C"-shape upper end portion in the shape of an arch.

4. The ground device of claim 3, wherein in the ground piece further includes a connection mounting portion for electrically connecting the inner metallic material and the ground piece.

5. The ground device of claim 1, wherein the connection terminal portion is integrally formed from a single piece with the ground piece and extends from an edge of a side of the ground piece, the connection terminal being bent to extend from the edge of the side of the ground piece toward an edge of the other side of the ground piece.

6. The ground device of claim 5, wherein in the ground piece further includes a support piece for supporting the connection terminal portion when a force is exerted on the connection terminal portion.

7. The ground device of claim 6, wherein the support piece is integrally formed from a single piece with the ground piece and is bent from the edge of an other side of the ground piece, the support piece protruding toward an inner side of the connection terminal portion.

8. The ground device of claim 1, wherein the ground device is manufactured by press molding.

9. A portable terminal comprising:
    an inner metallic material provided in an inner side of a main body of the portable terminal;
    an outer metallic material provided in a battery cover provided in an outer side of the main body; and
    a ground device for electrically connecting the inner metallic material with the outer metallic material,
    wherein the ground device comprises:
    a ground piece mounted in the main body to be connected with the inner metallic material; and
    a connection terminal portion which is integrally formed from a single piece with the ground piece by bending the connection terminal portion to extend from the ground piece, wherein the connection terminal portion is crossed over the ground piece.

10. The portable terminal of claim 9, wherein the connection terminal portion comprises:
    an elastic support portion which is integrally formed from a single piece with the ground piece and bent from an edge portion of the ground piece, the elastic support portion integrally formed from a single piece with the ground piece and being bent to extend from a side edge of the edge portion of the ground piece toward the other side edge portion of the ground piece opposite to the side edge; and
    a contact terminal which is integrally formed from a single piece with the ground piece and bent to protrude from an end portion of the elastic support portion and is in electrical contact with the outer metallic material.

11. The portable terminal of claim 10, wherein in the inner side of the main body is provided a ground surface to which the ground piece is securely affixed and electrically connected.

12. The portable terminal of claim 11, wherein in the ground surface further includes a ground opening which passes through the inner side and the outer side of the main body such that the connection terminal portion is exposed to the outside of the main body.

13. The portable terminal of claim 12, wherein in the ground piece further includes a fixing portion for bonding the ground piece onto the ground surface and a connection mounting portion for mounting the inner metallic material positioned in the inner side of the main body and the ground piece thereon, such that the inner metallic material and the ground piece are electrically connected.

14. The portable terminal of claim 13, wherein in the connection mounting portion further includes an engagement member for engaging the inner metallic material with the connection terminal portion, such that the inner metallic material and the connection terminal portion are electrically connected.

15. The portable terminal of claim 12, wherein the ground piece is installed on the ground surface, and the connection terminal portion is electrically connected to the outer metallic material through the ground opening.

16. The portable terminal of claim 10, wherein in the ground piece further includes a support piece for supporting the connection terminal portion when a force is exerted on the contact terminal portion.

17. The portable terminal of claim 16, wherein the support piece is integrally formed from a single piece with the ground piece, wherein the support piece is bent to extend from a edge portion of the ground piece opposite to the edge portion from which the elastic support portion is bent, wherein the support piece protrudes toward the inner side of the contact terminal.

18. The portable terminal of claim 10, wherein the elastic support portion is bent to extend as one piece from a longitudinal end portion of the ground piece in a semi-circular shape of a "C", and
    the contact terminal is bent to protrude as one piece from a "C"-shape upper end portion in the shape of an arch.

19. The portable terminal of claim 16, wherein the support piece limits the elastic deformation of the support portion to a predetermined amount.

20. The portable terminal of claim 16 wherein the support piece is elastically deformable a predetermined amount.

\* \* \* \* \*

UNITED STATES PATENT AND TRADEMARK OFFICE
CERTIFICATE OF CORRECTION

Page 1 of 1

PATENT NO.         : 9,320,132 B2
APPLICATION NO.    : 13/714572
DATED              : April 19, 2016
INVENTOR(S)        : Jun-Hwan Lee et al.

It is certified that error appears in the above-identified patent and that said Letters Patent is hereby corrected as shown below:

In the Claims

Column 10, Claim 2, Line 2 should read as follows:
--...support portion in a...--

Column 12, Claim 20, Line 20 should read as follows:
--...claim 16, wherein the...--

Signed and Sealed this
Seventh Day of June, 2016

Michelle K. Lee
*Director of the United States Patent and Trademark Office*